United States Patent [19]

Lottridge et al.

[11] Patent Number: 5,796,750
[45] Date of Patent: Aug. 18, 1998

[54] METHOD FOR PROGRAMMING A PROGRAMMABLE LOGIC DEVICE IN AN AUTOMATIC TESTER

[75] Inventors: Michael W. Lottridge, Tigard; Jock F. Tomlinson, Beaverton; Guy A. Townsend, Hillsboro, all of Oreg.

[73] Assignee: Lattice Semiconductor Corporation, Hillsboro, Oreg.

[21] Appl. No.: 696,444

[22] Filed: Aug. 13, 1996

Related U.S. Application Data

[62] Division of Ser. No. 232,546, Apr. 22, 1994.

[51] Int. Cl.$^6$ .................................................. G06F 11/00
[52] U.S. Cl. .................................................. 371/22.2
[58] Field of Search ........................... 365/185, 223; 371/22.2, 22.1, 22.5, 22.6, 27; 395/183.01

[56] References Cited

U.S. PATENT DOCUMENTS

| | | | |
|---|---|---|---|
| 4,855,954 | 8/1989 | Turner et al. | 365/185 |
| 4,879,688 | 11/1989 | Turner et al. | 365/201 |
| 4,896,296 | 1/1990 | Turner et al. | 365/189.08 |
| 4,930,107 | 5/1990 | Chan et al. | 365/189.08 |
| 5,121,394 | 6/1992 | Russell | 371/22.1 |
| 5,159,599 | 10/1992 | Steele et al. | 371/22.2 |
| 5,200,920 | 4/1993 | Norman et al. | 365/185 |
| 5,237,218 | 8/1993 | Josephson et al. | 307/465 |
| 5,237,219 | 8/1993 | Cliff | 307/465 |
| 5,301,416 | 4/1994 | Foerstel | 29/593 |

*Primary Examiner*—Vincent P. Canney
*Attorney, Agent, or Firm*—Skjerven, Morrill, Macpherson, Franklin & Friel; Edward C. Kwok

[57] ABSTRACT

A method for programming an in-system programmable logic device (IsPLD), using an automatic tester, includes the steps of: (i) expressing a fuse map for an IsPLD in the form of one or more test vectors to be applied in an automatic tester; (ii) including in a system board unprogrammed the IsPLD; (ii) mounting the system board on an automatic tester in a configuration for system testing; (iii) receiving into the automatic tester the test vectors; and (iv) and apply the test vectors to program the IsPLD. The system board with the IsPLD so programmed can proceed immediately to final test. In addition, a method is provided to translate a JEDEC file to a bit stream file, thereby achieving a eight-fold saving in storage requirement.

9 Claims, 10 Drawing Sheets

```
$pcf
 0
 4
 4
 6
 4
 0
 5
 7
 5
 0
 1
 3
 1
 1
 3
 1
 0
 2
 0
 0
 2
 0
 0
 2
 0
 5
 7
 5
 0
 0
 2
 0
$end pcf
$wait 110m
$pcf
 5
 7
 5
 .
 .
 .
```

```
! *********************************************************************
!                        TEST PROGRAM HEADER
! *********************************************************************
!
! Created:
! JEDEC input:
!
! *********************************************************************
!                        Declaration Section
! *********************************************************************

! SINGLE-PIN ASSIGNMENTS:

assign SCLK     to pins 1
assign SDI      to pins 2
assign SDO      to pins 3
assign MODE     to pins 4
assign ISPEN    to pins 5 family TTL

! TYPE CLASSIFICATIONS:

nondigital UNUSED inputs SCLK, SDI, MODE, ISPEN
outputs SDO pcf order is SDO, ISPEN, MODE, SCLK, SDO ! *********************************************************************
!                        VECTOR EXECUTION SECTION
! *********************************************************************
```

FIG. 7B

```
"X0000"
"X0010"
"X0000"
"X0010"
"X0000"
"X0010"
! Vector 100470
"X0101"
"X0111"
"X0001"
"X0011"
"X0001"
"X0011"
"X0001"
"X0011"
"X0000"
"X0010"
! Vector 100480
"X0000"
"X0010"
```

```
!
!**************************************************************************
!                        TEST PROGRAM HEADER
!
!**************************************************************************

!
! Created:    Thu Mar 31 15:56:13 1994
! JEDEC input:      cnt32a.jed
!
!
!**************************************************************************
!                        Declaration Section
!
!**************************************************************************

! SINGLE-PIN ASSIGNMENTS:

assign SCLK      to pins 1
assign SDI       to pins 2
assign SDO       to pins 3
assign MODE      to pins 4
assign ISPEN     to pins 5 family TTL

! TYPE CLASSIFICATIONS:

nondigital UNUSED inputs SCLK, SDI, MODE, ISPEN
outputs SDO pcf order is SDO, ISPEN, MODE, SCLK, SDI !
!**************************************************************************
!                        VECTOR EXECUTION SECTION
!
!************************************************************************** unit "u1"
pcf
"X0101"
"X0111"
! Vector 100460
"X0000"
"X0010"
"X0001"
"X0011"
```

FIG. 8A

METHOD FOR PROGRAMMING A PROGRAMMABLE LOGIC DEVICE IN AN AUTOMATIC TESTER

This application is a division of application Ser. No. 08/232,546, filed Apr. 22, 1994.

BACKGROUND OF THE INVENTION

1. Field of the Invention

The present invention relates to programmable logic devices; and in particular, the present invention relates to techniques for programming programmable logic devices.

2. Discussion of the Related Art

In-system programmable logic devices (IsPLDs) are widely used because an IsPLD can be programmed and reprogrammed in the system board on which such a device is included, without first being disconnected from such a system board. In-system programmability is an important advantage because operations which require replacement of the programmable logic device, e.g. for such purpose as "bug fixes" or "upgrades", can be accomplished economically, quickly and without possibility of mechanical damage due to handling.

Various structures and operation modes of IsPLDs are disclosed in the prior art, e.g. (i) U.S. Pat. No. 5,237,218, entitled "Structure and Method for Multiplexing Pins for In-system Programming", to G. Josephson et al, filed on May 3, 1991 and issued on Aug. 13, 1993; (ii) U.S. Pat. No. 4,896,296, entitled "Programmable Logic Device Configurable Input/Output Cell" to Turner et al, filed on Dec. 23, 1988, and issued on Jan. 23, 1990; (iii) U.S. Pat. No. 4,879,688, entitled "In-system Programmable Logic Device" to Turner et al, filed on May 13, 1986, issued on Nov. 7, 1989; and (iv) U.S. Pat. No. 4,855,954, entitled "In-system Programmable Logic Device with Four Dedicated Terminals" to Turner et al, filed on Oct. 25, 1988, and issued on Aug. 8, 1989.

In the prior art, an IsPLD can be programmed using a conventional "PAL programmer". The programmed IsPLD is then inserted into its assigned slot in the system board during assembly. The PAL programmer reads the programming data (e.g. a fuse map and configuration data) as input and applies electrical pulses under proper timing at the programming terminals of the IsPLDs. Vendors of programmable logic circuits often support computer aided-design tools which translate a logic circuit into an implementation in their programmable logic device. The fuse map of the implementation is often expressed in the "JEDEC file format", which is widely adopted in the industry.

The JEDEC file format referenced above is a standard file format widely adopted and promulgated by the Electronic Industries Association, Washington, D.C., for specifying programming data for programmable logic devices. In a JEDEC data file, programming data is represented by a string of logic values (i.e. '1's and '0's) expressed in ASCII characters. Thus, each logic value in the programming data of a JEDEC file is represented by 8 bits.

SUMMARY OF THE INVENTION

In accordance with the present invention, a method for programming a programmable logic device on a system board using an automatic tester includes the steps of: (a) creating a fuse map for the programmable logic device; (b) creating, from the fuse map, a set of test vectors executable on the automatic tester; (c) including in a system board the programmable logic device in an unprogrammed state; (d) mounting the system board onto the automatic tester in a configuration for board testing; and (v) applying the set of test vectors on the system board, thereby programming said programmable logic device.

In accordance with one method of the present invention, the test vectors are created by generating a plurality of programming instructions, using the fuse map as data and translating the programming instructions into the signals to be applied on the test pins of the automatic tester. In one embodiment, the fuse map is read into the automatic tester as a bit stream. Such a bit stream can be created from a JEDEC file.

In accordance with one aspect of the present invention, the signals to be applied to an automatic tester for programming a programmable logic device are first provided in a generic test vector file, in which is contained only tester independent data. The generic test vector can then be converted by conversion programs into tester specific test vector files for use in multiple dissimilar automatic testers. Such tester specific test vector files include machine specific parameters such as input/output parameters and timing parameters specific to each automatic tester.

In accordance with another aspect of the present invention, a method for translating a fuse map of a programmable logic array in a JEDEC file into a bit stream includes the steps of (a) searching for a value of the "QF" field in the JEDEC file; (b) determining from the value of the QF field the size of the fuse map; (c) allocating in a data structure the size of the fuse map of the programmable logic array; (c) reading from a fuse map field of the JEDEC file a fuse map corresponding to a program of the programmable logic array; and (d) for each fuse in the fuse map, according to whether the fuse is to be programmed or shorted, setting or resetting a corresponding bit in the data structure.

Because the present invention uses the test pins of an automatic tester to program IsPLDs of a system board, the present invention integrates the programming and testing steps.

The present invention is better understood upon consideration of the detailed description below and the accompanying drawings.

BRIEF DESCRIPTION OF THE DRAWINGS

FIG. 6 is an example of generic vector file 600.

FIG. 7b shows an example of a tester template for configuring a tester specific vector file; the template in FIG.

7b is suitable for use with an automatic tester available from Hewlett-Packard Company.

Figure 1:
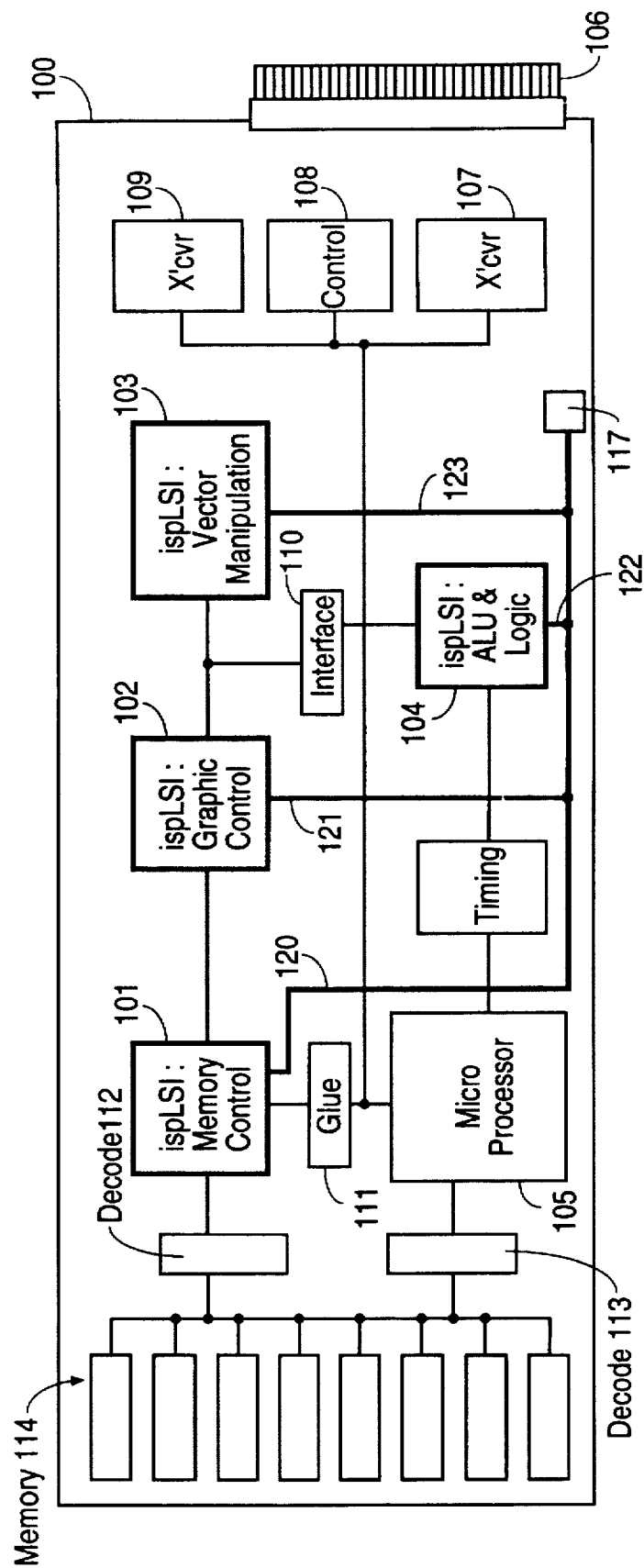
FIG. 1 shows IsPLDs 101–104 in a generic system board 100, which can be configured for one of several applications, depending on the circuit configurations programmed in the IsPLDs 101–104.
Figure 2:
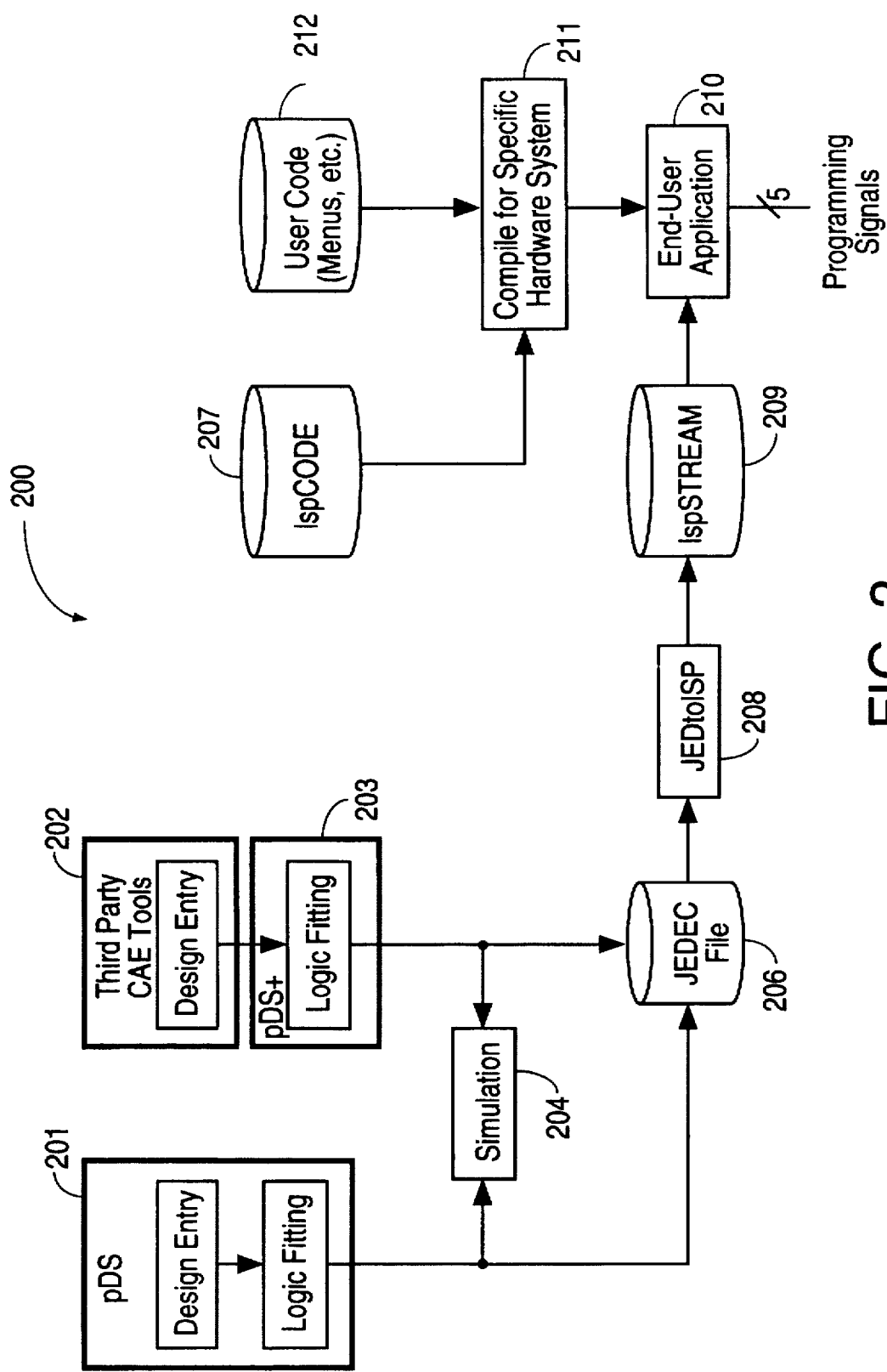
FIG. 2 shows the data flow 200 of a programming method used in created programming signals for programming a system including IsPLDs, such as FIG. 1's ISPLDs 101–104.
Figures 8, 8B:
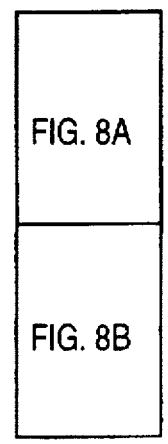

FIG. 8 consisting of FIGS. 8-1 and 8-2 are two pages of a listing of a generic vector file 600.

Appendix A1 which is incorporated by reference is a source listing of a file I22_conv.c, which includes an example program I22_jedtoisp conversion program.

Appendix A2 which is incorporated by reference is a source listing of a file isp22v.h, which includes the definition of a data structure I22_struct, which is an example of the ispStream data structure.

Appendix A3 which is incorporated by reference is a listing of a program isp_prog( ), which receives a bitstream file and outputs a generic vector file.

Appendix A4 which is incorporated by reference is a listing of the file isp22v.c, which includes a number of utility programs for reading and processing the ispStream data structure.

Appendices A5, A6, A7 and A8 which is incorporated by reference include I22_port.h, I22_port.c, I22_time.h and I22_time.c, which are respectively the header and code files for various utility routines relating to input and output, and the header and code files for various timing routines called by the utility routines of isp22v.c.

Appendix A9 which is incorporated by reference shows in a file labelled cnvt_hp.c an example program for generic to specific converter 710, which converts a generic vector file to one or more tester specific vector files for an automatic tester from Hewlett-Packard Company.

Appendix A10 which is incorporated by reference is a routine written for execution by text processing program "AWK" (available in most unix-based operating systems) which splits the machine specific test vector file generated by the conv_hp program of Appendix A9 into one or more tester specific vector files.

DETAILED DESCRIPTION OF THE PREFERRED EMBODIMENTS

The present invention relates to programming IsPLDs without using a conventional PAL Programmer. IsPLDs can now be programmed using 5 volts TTL level signals. Such IsPLDs include ispLSI 1016, ispLSI 1024, ispLSI 1032 and ispLSI 1048, all available from Lattice Semiconductor Corporation, Hillsboro, Oreg. Other similar IsPLDs can be obtained from Advanced MicroDevices, Inc. and Intel Corporation. This programming method is illustrated by example in the programming of a generic system board 100 shown in FIG. 1. The data flow of the programming method is illustrated by FIG. 2.

FIG. 1 shows IsPLDs 101–104 in a generic system board 100, which can be configured for one of several applications, depending on the circuit configurations programmed in the IsPLDs 101–104. As shown in FIG. 1, generic system board 100 represents a generic system for a multimedia application controlled by a microprocessor 105. IsPLDs 101, 102, 103 and 104 represents the logic circuits for (i) controlling memory 114, (ii) controlling a graphics displaying, (iii) processing audio signals, and (iv) providing random logic for integrating the functions of IsPLDs 101–103 and microprocessor 105. Elements 107–113 are logic functions known in the art. An in-system programming interface 117 is provided for programming each of IsPLDs 101–104. Connector 106 allows generic board 100 to be coupled to a bus, such as the PC-AT bus. As shown in FIG. 1, IsPLDs are programmed through their respective individual programming terminals represented by traces 120–123. However, a daisy-chain connection connecting IsPLDs 101–104, by connecting the serial data output (SDO) terminal of one IsPLD to the serial data input (SDI) terminal of another IsPLD, can also be provided. Parallel and serial programming of IsPLDs are known in the art.

During the board manufacturing process, IsPLDs are inserted into generic system board 100 in an unprogrammed state. Programming interface 117 is connected to a parallel port of a host computer, such as a microcomputer.

FIG. 2 shows the data flow 200 of a programming method used in created programming signals for programming a system including IsPLDs, such as FIG. 1's ISPLDs 101–104. As shown in FIG. 2, the circuits of IsPLDs 101–104 can be created in a design database, using suitable computer-aided design (CAE) tools. In FIG. 2, reference numeral 201 represents a design environment provided by the pDS software available from Lattice Semiconductor Corp. Reference numerals 202 and 203 represent a design environment using other CAE tools 202, but coupled to a pDS+ environment 203. pDS+ is also available from Lattice Semiconductor Corp. Environments pDS+ (201) and pDS (203) both provide a capability of translating a logic circuit into a JEDEC description. Typically, using these environments and engineering tools, such as simulation tools, represented by reference numeral 204, the configuration of each of IsPLD 101–104 is achieved. Environments 201 and 203 provide as output for each of IsPLDs 101–104 a configuration file, which is provided in the JEDEC format. These JEDEC files are data files for creating the programming signals.

To create a program which would receive a JEDEC file and output the programming signals through a parallel port of the microcomputer, the user writes In-system programming routines 207 using the library "ispCode" available from Lattice Semiconductor Corp. The content and use of the "ispCode" library is explained in "ispCode Programmer's Reference Manual", which can be obtained from Lattice Semiconductor Corp. The user then uses a compiler, represented by reference numeral 211, to compile in-system programming routines 207 with a user program 212 to create an executable program 210, which includes the control program for the sending the programming signals through a parallel port and a user interface for the user's control of the execution. In data flow 200, before being provided to executable program 210, JEDEC files 206 are translated into "ispStream" format files 209 using conversion program 209 (called "JEDtoISP"), available from Lattice Semiconductor Corp. While the JEDEC files are compatible with other engineering tools in the industry, the "ispStream" format is considered more efficient for the present application.

When executed, executable program 210 sends programming signals to interface 117 to program IsPLDs 101–104. In this manner, IsPLDs are programmed in generic system board 100. Reprogramming of IsPLDs 101–104 in generic system board 100 can be accomplished in the same manner.

After IsPLDs 101–104 are programmed, the next step in a typical manufacturing process requires taking generic system board 100 to an automatic tester for testing. The purpose of the testing is to uncover any defect in any of the devices on generic system board 100 which may result in generic system board 100 not meeting a target specification. An automatic tester provides a number of test pins which are coupled by connectors to the circuit under test. A typical testing requires the application of a large number of test vectors, i.e. signal patterns applied to the circuit interface (e.g. connector 106) through the pins of the automatic tester.

Alternatively, the present invention allows programming of IsPLDs using the test pins of any automatic test equipment, such as automatic testers. Examples of automatic testers include Hewlett-Packard 3070, 3060 and 3073 testers, from Hewlett Packard Company, and GenRad 2700, from Genrad Corporation. An automatic tester provides a number of pins which are coupled by connectors to the circuit under test. However, the typical automatic tester possesses neither the memory capacity nor the operating system support of a general purpose computer. Consequently, the method of programming IsPLDs 101–104 through programming interface 117 using an output port of a general purpose computer illustrated in FIG. 1 and 2 is not generally available in an automatic tester.

Using the test pins of an automatic tester to program IsPLDs of a system board integrates the programming and testing steps. When programming IsPLDs using an automatic tester, unlike programming the unprogrammed IsPLDs 101–104 on generic system board 100, programming is not provided over programming interface 117. Instead, generic system board 100 is mounted in the automatic tester in the test configuration. The unprogrammed devices on the system board 100 are then programmed under the method to be described below with respect to FIG. 3, and then the test vectors are applied to perform a final test the programmed system board.

Figure 3:
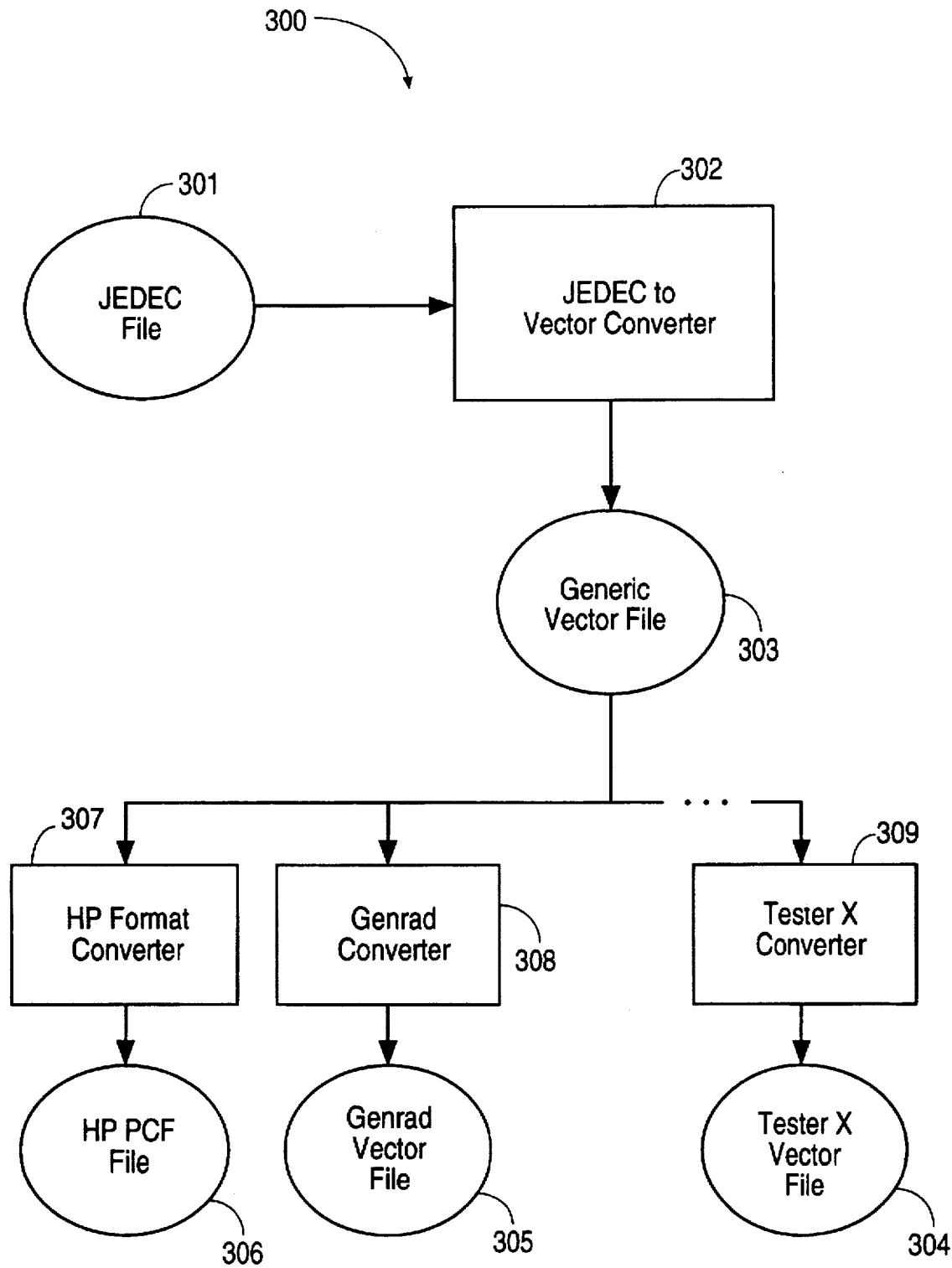
FIG. 3 illustrates the data flow 300 of a method for programming IsPLDs on an automatic tester, in accordance with the present invention.

FIG. 3 illustrates the data flow 300 of a method for programming IsPLDs on an automatic tester, in accordance with the present invention. As shown in FIG. 3, a JEDEC file 301 including the programming data for an IsPLD is provided to a "JEDEC to vector" converter 302 to create a generic vector file 303. JEDEC to vector converter 302 can be implemented by the method described below. Generic vector file 303 contains the programming information extracted from JEDEC file 301 by JEDEC to vector converter 302. Such programming information is expressed as test vectors in generic vector file 303 without including parametric values of a particular automatic tester. Specific conversion programs, shown in FIG. 3 as conversion programs 307, 308 and 309, each targeted to a commercially available automatic tester, can each convert generic vector file 303 into their respective machine specific vector file. These machine specific vector files are shown in FIG. 3 as "HP PCF" file 306, "Genrad" vector file 305 and "Tester X" vector file 304. In this illustration, PCF is a test vector data format supported by Hewlett-Packard & Company, and Genrad generally refers to the test vector format supported by GenRad Corporation.

Figure 4:
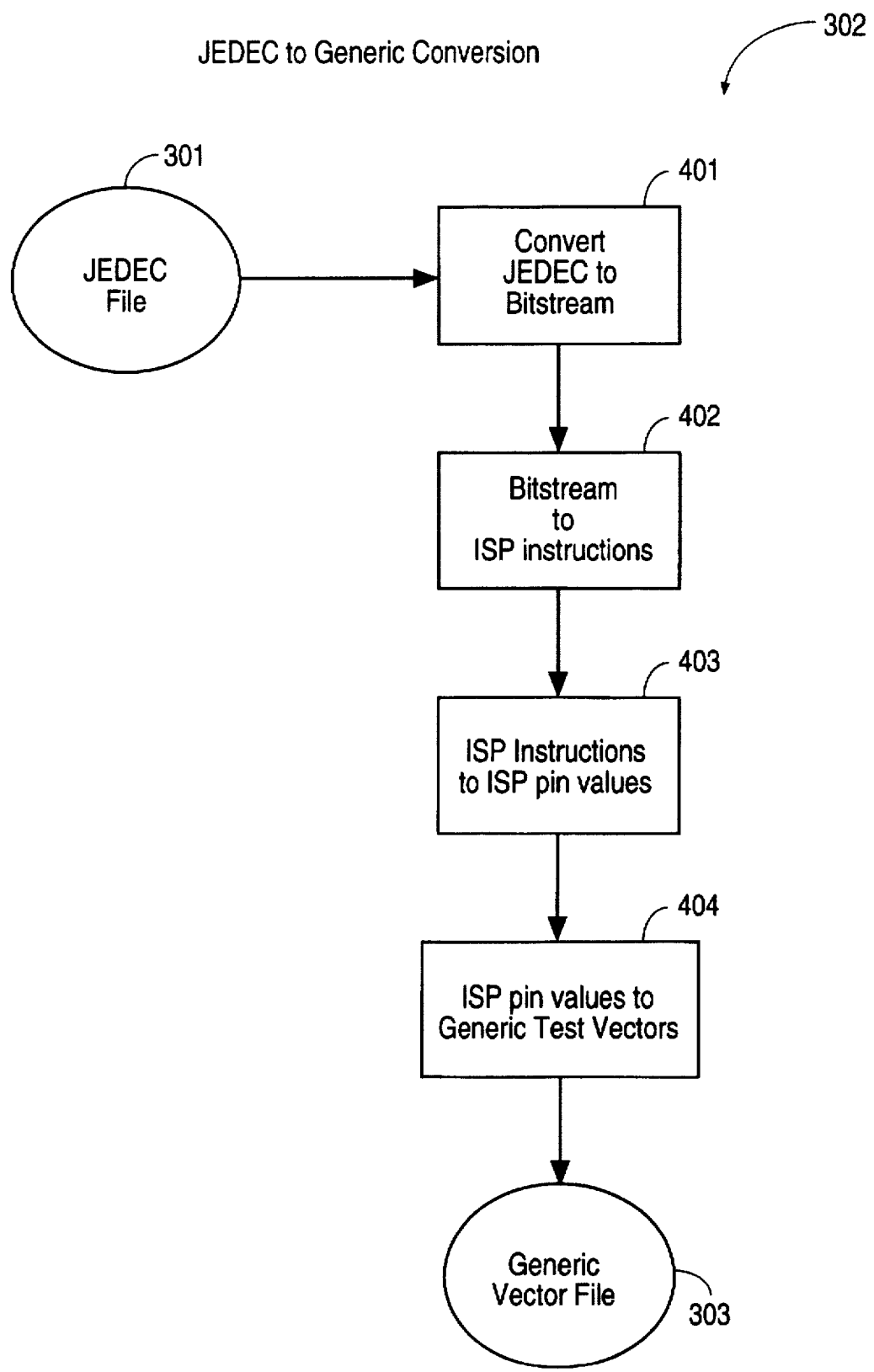
FIG. 4 shows a block diagram of data flow in JEDEC to vector converter 302 referenced above.

FIG. 4 shows a block diagram of the major steps in JEDEC to vector converter 302 referenced above. As shown in FIG. 4, JEDEC to vector converter 302 receives JEDEC file 301 and converts the programming data in JEDEC File 301 into an ispStream file at step 401, which is described in further detail below. One embodiment of a program used in step 401 to transform the JEDEC file 301 into an ispStream format file is provided in the function I22_jedtoisp( ) of the source listing I22_conv.c, which is included in Appendix A1.

As is known in the art, each JEDEC file includes fields separated by a separator character "*". To retrieve programming data, the following fields are read into an ispStream data structure: (i) "QF", which identifies the IsPLD to be programmed; (ii) a number of "Ln" (link) fields, where n is an integer represented in ASCII numerals (base 10), each specifying the intended programmed states of a number of fuses identified by the "fuse number" n; and (iii) if an user string ("UES string") is encountered, i.e. a field "U" is identified, the user string is also placed into the ispStream data structure. One example of an ispStream data structure, suitable for use with a 22V10 IsPLD from Lattice Semiconductor Corp is provided in Appendix A2, in the listing header file isp22v.h, as I22_struct.

Figure 5:
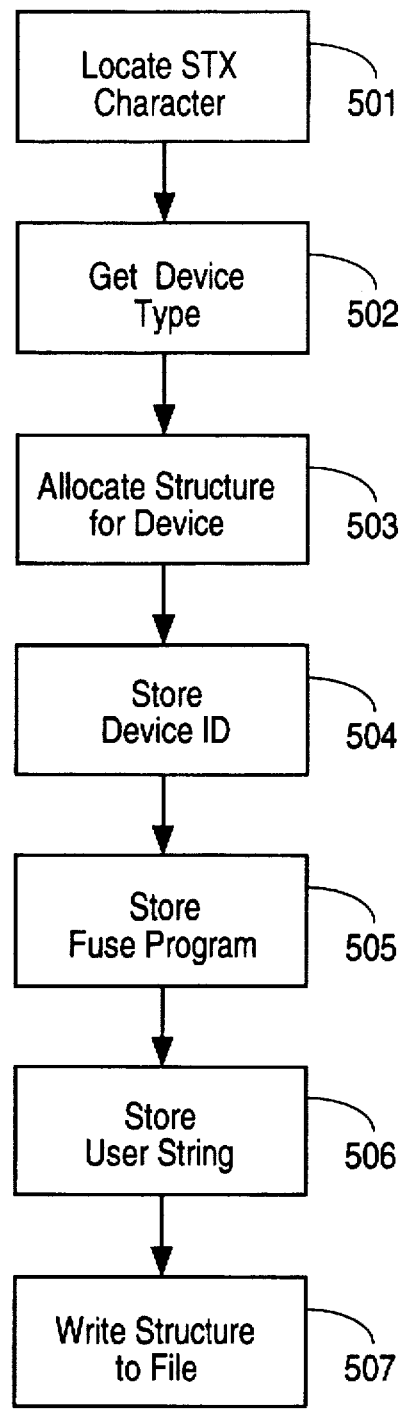
FIG. 5 is a block diagram of the functional steps 501–507 used in step 401 of FIG. 4 to convert a JEDEC to an ispStream file.

FIG. 5 is a block diagram of the functional steps 501–507 used in step 401 of FIG. 4 to convert a JEDEC to an ispStream file. As shown in FIG. 5, at step 501, JEDEC file 301 is opened and the "start file" character, which is a byte with the value x02 (STX), is located. At step 502, from the position in JEDEC file 301 where the STX character is found, the JEDEC file is scanned for a device type set forth in the "QF" field. Using the device type found in step 502, a structure is allocated to create the ispStream data. In the implementation of I22_struct of Appendix A2, the allocated structure include a bitstream "stream" in which the first byte identifies the device type of the IsPLD, and each subsequent bit defines the programmed value of a fuse in the identified IsPLD. Upon identifying the device type, the size of the "stream" is determined. At step 504, the identified device type is stored in the first byte of "stream". At step 505, the "Ln" fields are identified, and the corresponding fuse map is read. In the JEDEC file, whether each fuse is shorted or left open is defined according to whether the ASCII character "1" or the ASCII character "0" in the corresponding fuse position in the link fields. At step 505, the program value of each fuse is set in the corresponding bit of "stream". If a user string is encountered, the user string is written into a string buffer "ues". Finally, at step 507, the data structure I22_struct is written out into a binary file identified by the extension ".isp". Since a JEDEC file represent each fuse by an 8-bit character, the "stream", which allocates only 1 bit per fuse, realizes a tremendous saving in the resulting ".isp" file. In an automatic tester, because the size of available memory can be very restricted. Thus, to retrieve the fuse map from JEDEC file 301, either a large memory or sophisticated file-buffering techniques are necessary. Because an IsPLD can have a large number of fuses, the memory requirements of the programming data in a ".isp" file can be reduced to approximately ⅛ of the corresponding JEDEC file. U.S. Pat. No. 5,237,218, entitled "Structure and Method for Multiplexing Pins for In-system Programming", to G. Josephson et al, filed on May 3, 1991 and issued on Aug. 13, 1993, describes a state machine for programming an IsPLD, and provides examples of ISP instructions executable by a state machine of an IsPLD. A detailed description of the operation of the state machine of an IsPLD is therefore omitted.

The programming information in ispStream file is then incorporated at step 402 into ISP instructions. The above referenced U.S. Pat. No. 5,237,218 describes an ISP state machine and the use of the ISP programming pins SCLK (shift clock), MODE (mode), ISPEN (ISP enable), SDI (serial data in) and SDO (serial data out) in the ISP machine for programming an IsPLD. At step 403, the ISP instructions are mapped into the signals to be applied to the ISP programming pins. At step 404, the signals of the ISP Programming pins are included as test vectors of generic vector file 303.

FIG. 6 shows an example of a generic vector file 600. In this example, the test vectors are each expressed in decimal format (e.g. a vector "00111" would be expressed as "7"). As shown in FIG. 6, a "$wait" statement is provided to indicate a timing requirement between applications of two test vectors. The test vectors between two wait statements are enclosed within a "$pcf" and "$end pcf" pair.

Appendix A3 is a listing of a program isp_prog( ), which receives a bitstream file and outputs a generic vector file.

The program isp_prog( ) calls a program I22_program( ), which is included in the file isp22v.c. Appendix A4 is a listing of the file isp22v.c. The file isp22v.c also includes a number of utility routines called by I22_program, or used by other programs for reading and processing the ispStream file. Appendices A5, A6, A7 and A8 include I22_port.h, I22_port.c, I22_time.h and I22_time.c. I22_port.h and I22_time.h are header files for I22_port.c and I22_time.c respectively. I22_port.c and I22_time.h includes input/output routines and timing routines for specifying ISP programming.

Figure 7A:
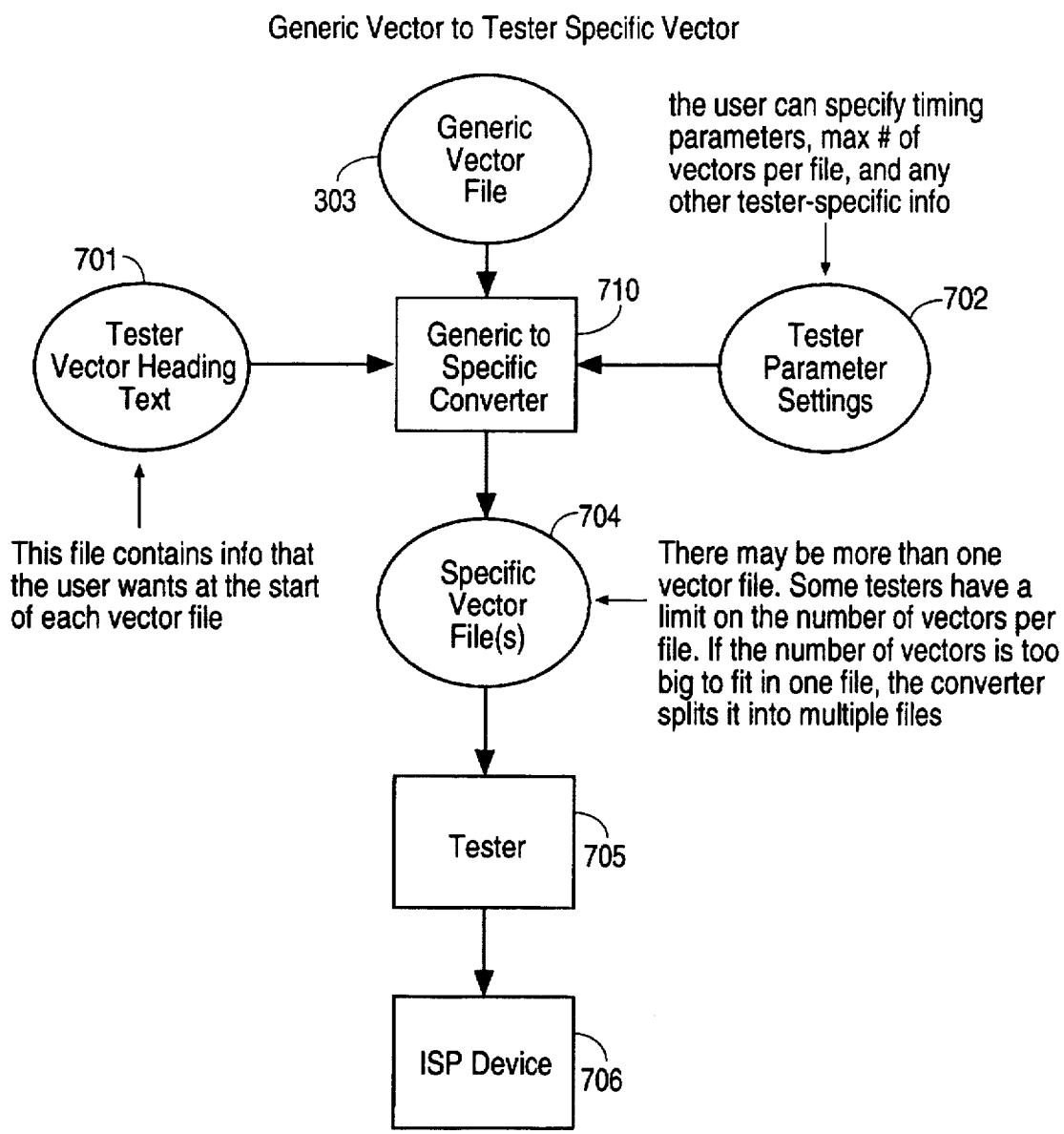
FIG. 7a shows the steps in method 700 of the present invention, taking a generic vector file 303 to the programming of a IsPLD 706.

FIG. 7a shows the steps in method 700 of the present invention, taking a generic vector file 303 to the programming of a IsPLD 706. As shown in FIG. 7a, generic vector file 303 is provided to a generic to specific converter module 710 to create a specific vector file 704 which can be executed in a target tester, represented generally by reference numeral 705. Generic to specific converter module 710 receives also a template file 701, which includes a template for specifying the pin configuration of the ISP signals. FIG. 7b is an example of a template file for an automatic tester from Hewlett-Packard & Company. FIG. 7b shows the following sections are predetermined: (i) "TEST PROGRAM HEADER", which sets forth both the date of generation of vector file 600 and the source JEDEC file, and (ii) "DECLARATION SECTION", which sets forth automatic tester pin assignments for signals SCLK, SDI, SDO, MODE and ISPEN. Sections (i) and (ii) are independent from the test vectors generated in accordance with the present invention.

Generic to specific converter module 710 is tester specific. This task is one of combining generic vector file 303 with template file 701 and the specific parameters settings of the target automatic tester, such as timing parameters, input and output parameters, and maximum number of vectors. An example program for generic to specific converter 710 is found in the cnvt_hp.c file, provided here as Appendix A9, which converts a generic vector file to one or more tester specific vector files for an automatic tester from Hewlett-Packard Company. Where the specific tester limits the maximum number of vectors, the ISP programming "test vectors" are included in multiple tester specific vector files. Appendix A10 is a routine written for execution by text processing program "AWK" (available in most unix-based operating systems) which splits the machine specific test vector file generated by the conv_hp program of Appendix A9 into one or more tester specific vector files.

FIGS. 8-1 and 8-2 are two pages of a listing of a vector file executable by an automatic tester from Hewlett-Packard Company.

The above detailed description is provided to illustrate the specific embodiments of the present invention and is not intended to be limiting. Numerous variations and modifications within the scope of the present invention are possible. The present invention is set forth in the following claims. We claim:

1. A method for programming a programmable logic device on a system board using an automatic tester, said system board having a test interface over which functional testing of said system board can be achieved, said method comprising the steps of:
   providing through said test interface access to programming pins of said programmable logic device;
   creating a fuse map for said programmable logic device;
   creating, from said fuse map, a first set of test vectors executable on said automatic tester, said first set of vectors including, for implementing said fuse map, specific signals to be applied to said programming pins of said programmable logic device through said test interface;
   creating a second set of test vectors to be applied to said system board through said test interface for a functional test of said system board;
   including said programmable logic device in an unprogrammed state in said system board;
   mounting said system board, including said programmable logic device in said unprogrammed state, onto said automatic tester in a configuration for functional testing of said system board through said test interface;
   applying, through said test interface, said first set of test vectors on said system board, thereby programming said programmable logic device; and
   applying said second set of test vectors through said test interface, after said step of applying said first set of test vectors, to perform said functional test of said system board.

2. A method as in claim 1, wherein said step of creating a set of first test vectors comprises the steps of:
   generating a plurality of programming instructions, using as data said fuse map; and
   translating said plurality of programming instructions into the signals to be applied on test pins of said automatic tester coupled to said test interface of said system board.

3. A method as in claim 2, wherein said fuse map is read into said automatic tester as a bit stream.

4. A method as in claim 3, wherein said bit stream is created from a JEDEC file.

5. A method as in claim 2, further comprising the step of writing said signals to be applied on test pins of said automatic tester into a first test vector file, said first vector file including tester independent data only.

6. A method as in claim 5, further comprising the step of creating a second test vector file by including in said second test vector file tester specific data.

7. A method as in claim 5, wherein said tester specific data includes timing parameters of said automatic tester.

8. A method for translating a fuse map of a programmable logic device in a JEDEC file into a bit stream, and programming in-system said programming logic device using said bit stream, said method comprising the steps of:
   searching for a value of the "QF" field in said JEDEC file;
   determining from said value the size of said fuse map;
   allocating in a data structure said size of said fuse map of said programmable logic device;
   reading from a fuse map field of said JEDEC file a fuse map corresponding to a program of said programmable logic device;
   for each fuse in said fuse map, in accordance to whether said fuse is to be programmed or shorted, modifying said fuse map by setting or resetting a corresponding bit in said data structure;
   converting said modified fuse map to a first set of test vectors acceptable by an automatic tester;
   incorporating said programmable logic device in a system board, said system board having a test interface for functional testing and providing access from said test interface to programming pins of said programmable logic device;
   creating a second set of test vectors for functional testing said system board through said test interface;

mounting said system board on to said automatic tester in a configuration which allows functional testing of said system board using said automatic tester through said test interface; and programming said programmable logic device by applying said first set of test vectors through said tester interface to said system board; and functional testing said system board by applying said second set of test vectors over said test interface.

9. A method as in claim 8, further comprising the step of storing said data structure in a bit stream file.

* * * * *